United States Patent
Conley, Jr. et al.

(10) Patent No.: US 7,303,631 B2
(45) Date of Patent: *Dec. 4, 2007

(54) SELECTIVE GROWTH OF ZNO NANOSTRUCTURE USING A PATTERNED ALD ZNO SEED LAYER

(75) Inventors: John F. Conley, Jr., Camas, WA (US); Lisa H. Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 345 days.

This patent is subject to a terminal disclaimer.

(21) Appl. No.: 10/977,430

(22) Filed: Oct. 29, 2004

(65) Prior Publication Data
US 2006/0090693 A1    May 4, 2006

(51) Int. Cl.
*C30B 25/04* (2006.01)
(52) U.S. Cl. .............. 117/94; 117/95; 117/96; 117/940
(58) Field of Classification Search .......... 117/94, 117/95, 96, 940
See application file for complete search history.

(56) References Cited
U.S. PATENT DOCUMENTS
2005/0009224 A1*  1/2005  Yang et al. .............. 438/57

2006/0091499 A1*  5/2006  Stecker et al. ............ 257/614

OTHER PUBLICATIONS

Article entitled, "Nanoscale Science and Technology: Building a Big Future from Small Things", by C. M. Lieber, published in MRS Bulletin/Jul. 2003, pp. 486-491.
Article entitled, "Room-Temperature Ultraviolet Nanowire Nanolasers", by M. H. Huang et al., published in Science Mag. vol. 292, Jun. 8, 2001, pp. 1897-1899.
Article entitled, "Controlled Growth of ZnO Nanowires and Their Optical Properties", by P. Yang et al., published in Adv. Funct. Mater. 2002, 12, No. 5, May, pp. 323-331.

* cited by examiner

*Primary Examiner*—Robert Kunemund

(57) ABSTRACT

Patterned zinc-oxide nanostructures are grown without using a metal catalyst by forming a seed layer of polycrystalline zinc oxide on a surface of a substrate. The seed layer can be formed by an atomic layer deposition technique. The seed layer is patterned, such as by etching, and growth of at least one zinc-oxide nanostructure is induced substantially over the patterned seed layer by, for example, exposing the patterned seed layer to zinc vapor in the presence of a trace amount of oxygen. The seed layer can alternatively be formed by using a spin-on technique, such as a metal organic deposition technique, a spray pyrolysis technique, an RF sputtering technique or by oxidation of a zinc thin film layer formed on the substrate.

35 Claims, 4 Drawing Sheets

SELECTIVE GROWTH OF ZNO NANOSTRUCTURE USING A PATTERNED ALD ZNO SEED LAYER

BACKGROUND OF THE INVENTION

1. Field of the Invention

The present invention relates to nanotechnology and/or microelectronics. In particular, the present invention relates a method for forming zinc-oxide (ZnO) nanostructures on a silicon (Si) substrate.

2. Description of the Related Art

Nanostructured materials, such as nanowires, nanorods, nanofibers, whiskers, etc., exhibit interesting optical and electronic properties and have been demonstrated for many applications, such as chemical and bio sensors and detectors, LEDs, transistors, lasers, field emitters, etc. See, for example, P. Yang et al., "Controlled growth of ZnO nanowires and their optical properties," Adv. Func. Mat. 12(5), 323 (2002) and C. M. Lieber, "Nanoscale science and technology: Building a big future from small things," MRS Bulletin, pp. 486-491, (July 2003). Zinc oxide (ZnO), in particular, exhibits many interesting properties for nanostructures that could be useful for solid-state optoelectronic light emitters, chemical sensors, and gas detectors.

One of the primary techniques used for forming nanostructures is vapor-liquid-solid (VLS) growth. Other techniques, such as laser ablation and arc discharge, have also been used to form nanostructures. A VLS growth mechanism typically requires a metal catalyst. At an appropriate temperature range, the catalyst forms a liquid solution with the desired growth material. When the liquid droplet becomes supersaturated with the desired growth material, the desired material nucleates, resulting in growth of a nanostructure. For example, a thin film (~3 nm) of a catalyst, such as gold (Au), is often used. Nanostructures are observed to grow wherever Au is present. Selective growth of nanostructures is conventionally achieved by patterning the Au catalyst either by dispersing Au nanoparticles onto a substrate, or by evaporating Au through a patterned shadow mask.

Nevertheless, dispersing particles onto a substrate in the ultra clean environments used for microelectronic fabrication is not desirable. Additionally, the metals used as catalysts for nanostructure growth are typically difficult to etch and, consequently, are difficult to subtractively pattern. Moreover, the metals used as catalysts are typically difficult to chemical mechanical polish (CMP). Accordingly, nanostructure catalyst materials are typically difficult to pattern via conventional microelectronic processes. Further, contamination from using a metal catalyst is also a concern because an eventual goal is to integrate nanostructures into a Si CMOS process and metal-catalyst contamination is potentially deleterious to Si CMOS devices. Accordingly, elimination of the metal catalyst would be beneficial for reducing wafer and equipment contamination.

Consequently, what is needed is a technique for selectively growing ZnO nanostructures without using a metal catalyst.

SUMMARY OF THE INVENTION

The present invention provides a technique for producing selectively patterned ZnO nanostructures without using a metal catalyst.

The advantages of the present invention are provided by a method of selectively forming a zinc-oxide nanostructure in which a substrate is provided, a seed layer of polycrystalline zinc oxide that is at least about 0.5 nm thick is formed on a surface of the substrate, the seed layer is patterned, such as by etching, and growth of at least one zinc-oxide nanostructure is induced substantially over the patterned seed layer by, for example, exposing the patterned seed layer to zinc vapor in the presence of a trace amount of oxygen. The zinc vapor can be formed by carbothermal reduction of zinc oxide. The seed layer can be formed by using an atomic layer deposition (ALD) technique, such as by using alternating pulses of a diethylzinc precursor and water vapor. In another exemplary embodiment of the present invention, the seed layer is formed by using a spin-on technique, such as a metal organic deposition (MOD) technique, a spray pyrolisis technique, an RF sputtering technique or by oxidation of a Zn thin film layer formed on the substrate.

The present invention also provides a zinc-oxide nanostructure that is formed by providing a substrate, forming a seed layer of polycrystalline zinc oxide that is at least about 0.5 nm thick on a surface of the substrate, patterning the seed layer, such as by etching, and inducing growth of at least one zinc-oxide nanostructure substantially over the patterned seed layer by, for example, exposing the patterned seed layer to zinc vapor in the presence of a trace amount of oxygen. The seed layer can be formed by using an atomic layer deposition (ALD) technique, such as by using alternating pulses of a diethylzinc precursor and water vapor. The zinc vapor can be formed by carbothermal reduction of zinc oxide. In another exemplary embodiment of the present invention, the seed layer is formed by using a spin-on technique, such as a metal organic deposition (MOD) technique, a spray pyrolisis technique, an RF sputtering technique or by oxidation of a Zn thin film layer formed on the substrate.

The present invention also provides a zinc-oxide nanostructure that includes a substrate, a patterned seed layer of polycrystalline zinc oxide formed on a surface of the substrate, and at least one zinc-oxide nanostructure formed substantially over the patterned seed layer. The seed layer is at least about 0.5 nm thick and can be formed by an atomic layer deposition (ALD) technique, such as by using alternating pulses of a diethylzinc precursor and water vapor. The seed layer is patterned by etching. At least one zinc-oxide nanostructure is formed by exposing the patterned seed layer to zinc vapor in the presence of a trace amount of oxygen. Zinc vapor can be generated by carbothermal reduction of zinc oxide. In another exemplary embodiment of the present invention, the seed layer is formed by using a spin-on technique, such as a metal organic deposition (MOD) technique, a spray pyrolisis technique, an RF sputtering technique or by oxidation of a Zn thin film layer formed on the substrate.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE PRESENT INVENTION

The present invention provides two techniques for achieving selective growth of ZnO nanostructures on a Si substrate that avoid use of a metal catalyst. In one exemplary embodiment of the present invention, ZnO nanostructures are selectively grown on atomic-layer-deposited (ALD) polycrystalline ZnO using a vapor-solid mechanism. In another exemplary embodiment of the present invention, ZnO nanostructures are selectively grown on Metal Organic Deposition (MOD) ZnO, also using a vapor-solid mechanism. For both exemplary embodiments, the present invention produces a more consistent and repeatable selective nanostructure growth region than is obtained by using conventional techniques of a metal catalyst or by surface roughening. Moreover, because an eventual goal is to integrate nanostructures into a Si CMOS process, elimination of use of a metal catalyst for growing ZnO nanostructures also avoids metal-catalyst contamination of Si CMOS devices, which is potentially deleterious to Si CMOS devices.

Figure 1:
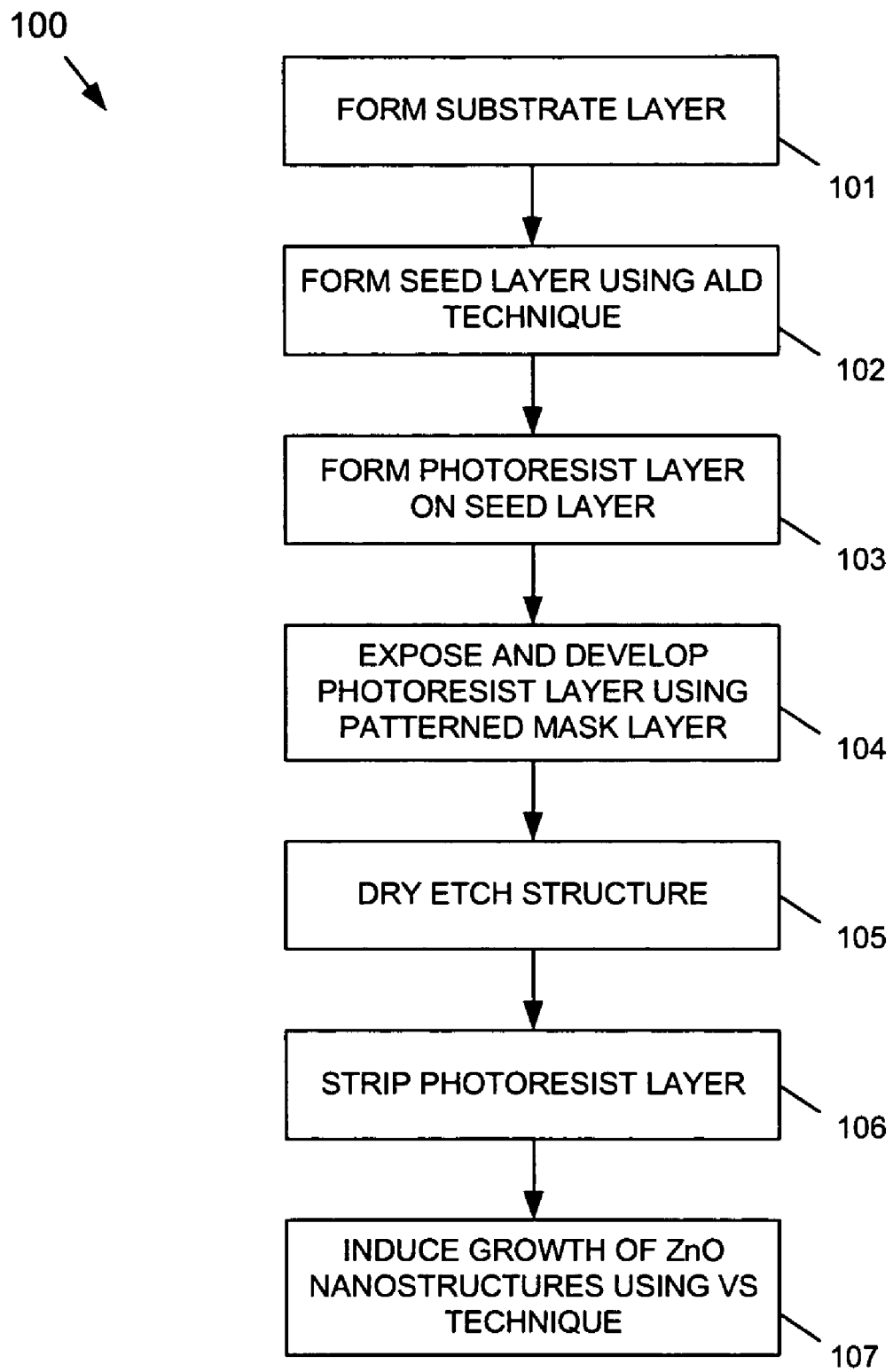
FIG. 1 depicts a flowchart for a first exemplary embodiment of a technique for selectively forming ZnO nanostructures according to the present invention.
Figure 2A:
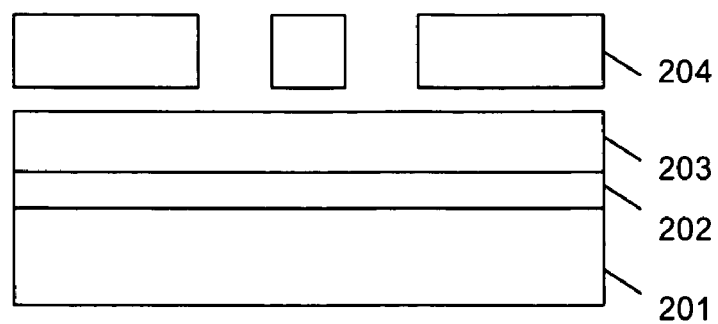
FIGS. 2A-2D depict a sequence of cross-sectional views of a substrate and ZnO nanostructures that are formed by the first exemplary embodiment of a technique for selectively forming ZnO nanostructures according to the present invention.

FIG. 1 depicts a flowchart for a first exemplary embodiment 100 of a technique for selectively forming ZnO nanostructures according to the present invention. FIGS. 2A-2D depict a sequence of cross-sectional views of a substrate and ZnO nanostructures that are formed by the first exemplary embodiment of a technique for selectively forming ZnO nanostructures according to the present invention. At step 101 in FIG. 1, a clean Si (100), or Si (111) starting wafer is used as a substrate layer 201 (FIG. 2A). At step 102, a thin seed layer 202 of polycrystalline ZnO is deposited on the surface of substrate layer 201 using Atomic Layer Deposition (ALD) (FIG. 2A). For ALD, precursors are pulsed alternately into the deposition chamber and are separated by purges. Reactions take place on the substrate surface and are self-limiting. Film thickness is controlled by the number of precursor pulse/purge cycles. The self-limiting nature of the process allows for uniformity and excellent conformality. In one exemplary embodiment, layer 202 is formed by alternating pulses of diethylzinc (DEZ) precursor and $H_2O$ vapor at a substrate temperature of between about 130° C. and 180° C. to form ALD ZnO that is about 6 nm thick. Consistent and uniform nanowire growth can be induced for a seed layer that is at least about 0.5 nm thick. In principle, any thickness of ALD ZnO for seed layer 202 could be used. Alternatively, other precursors, such as di-methyl zinc, zinc acetate and zinc chloride, could be used to form ALD ZnO. Additionally, after seed layer 202 has been formed, seed layer 202 could be annealed to modify the crystalline structure of seed layer 202.

At step 103, the wafer structure formed by substrate 201 and seed layer 202 is coated with a layer of photoresist 203. At step 104, photoresist layer 203 is exposed and developed using a patterned mask layer 204. FIG. 2A depicts a cross-sectional view of the wafer structure formed by substrate layer 201, seed layer 202, photoresist layer 203 and patterned mask layer 204 before photoresist layer 203 is exposed and developed.

Figure 2B:
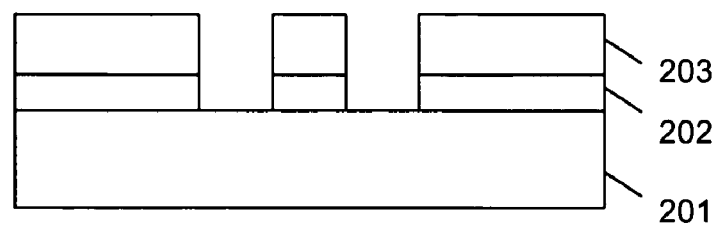

At step 105, the wafer structure is dry etched. FIG. 2B depicts a cross-sectional view of the wafer structure after dry etching. For example, a standard poly etch using chorine ($Cl_2$) and bromine ($Br_2$) gases could be used, followed by a highly selective low-bias $Br_2$ gas etch in step 105 to provide an undamaged surface of Si. Alternatively, the wafer structure could be wet etched in a well-known manner.

Figure 2C:
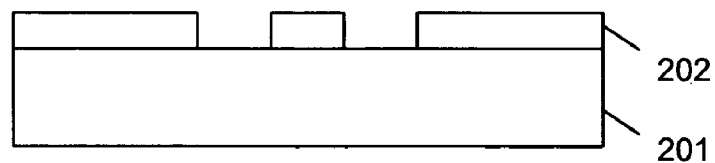

At step 106, photoresist layer 203 is stripped in a well-known manner. FIG. 2C depicts a cross-sectional view of the wafer structure after photoresist layer 203 has been stripped.

Figure 2D:
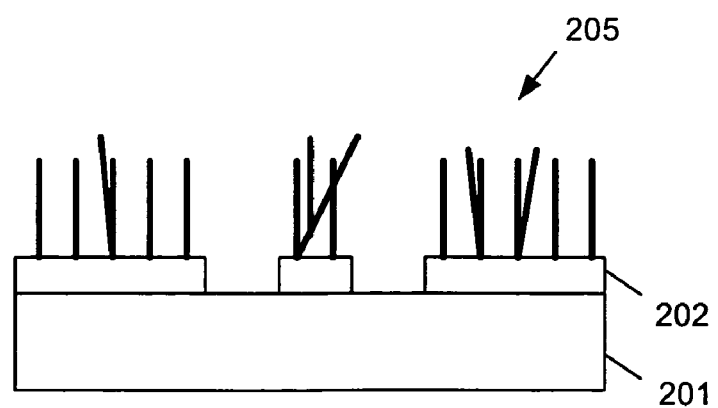

At step 107, ZnO nanostructure growth is induced via a vapor-solid mechanism to form nanostructures 205, shown in FIG. 2D. ZnO nanowire growth occurs only in regions of substrate 201 that were left coated with seed layer 202. In particular, the wafer structure formed by layers 201 and 202 and depicted in FIG. 2C is exposed to Zn vapor at about 915° C. for about 30 minutes with a flow of about 30-80 sccm Ar and a trace amount of oxygen. Zinc vapor is generated by, for example, carbothermal reduction of ZnO power using equal parts of ZnO and graphite. In principle, however, any method of supplying gaseous phase Zn for growing ZnO nanostructures would be suitable.

Figure 3:
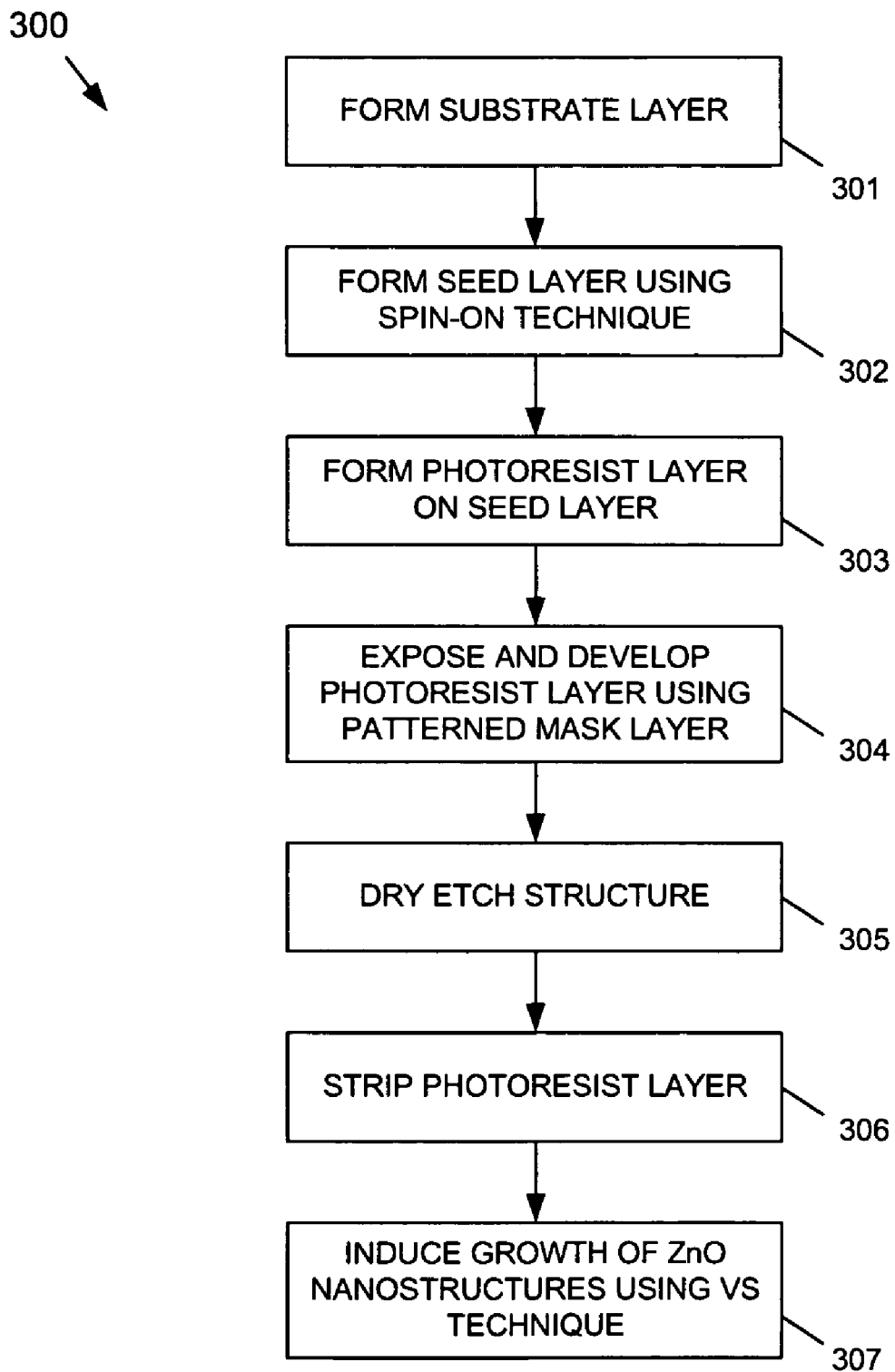
FIG. 3 depicts a flowchart for a second exemplary embodiment of a technique for selectively forming ZnO nanostructures according to the present invention.
Figure 4A:
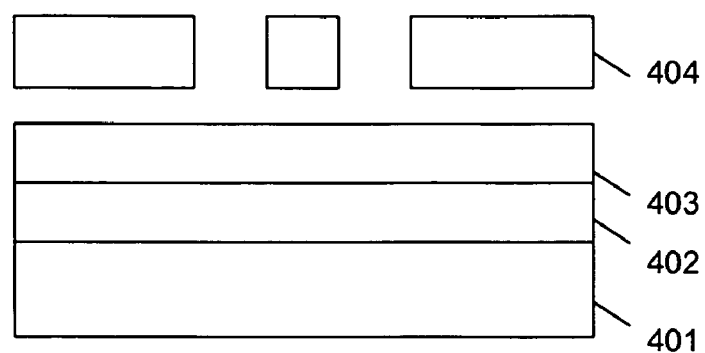
FIGS. 4A to 4D depict a sequence of cross-sectional views of a substrate and ZnO nanostructures that are formed by the second exemplary embodiment of a technique for selectively forming ZnO nanostructures according to the present invention.
Figure 4B:
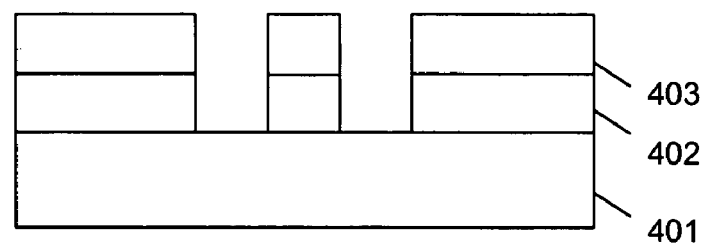

FIG. 3 depicts a flowchart for a second exemplary embodiment 300 of a technique for selectively forming ZnO nanostructures according to the present invention. FIGS. 4A and 4B depict a sequence of cross-sectional views of a substrate and ZnO nanostructures that are formed by the second exemplary embodiment of a technique for selectively forming ZnO nanostructures according to the present invention. At step 301 in FIG. 3, a clean Si (100) or Si (111) starting wafer is used as a substrate layer 401 (FIG. 4A). At step 302, a thin seed layer 402 of polycrystalline ZnO is deposited on the surface of substrate layer 401 using a spin-on technique (FIG. 4A). In one exemplary embodiment, layer 402 is formed by a Metal Organic Deposition (MOD) technique using zinc acetate dehydrate in 2-methoxyethanol and ethanolamine to form MOD ZnO that is about 80 nm thick. Any thickness of MOD ZnO for seed layer 402 could be used. Alternatively, ZnO layer 402 could be deposited using other methods, such as spray pyrolisis, RF sputtering, or by oxidation of a Zn thin film layer formed on substrate 401. Additionally, seed layer 402 could be annealed to modify the crystalline structure of seed layer 402.

At step 303, the wafer structure formed by substrate 401 and seed layer 402 is coated with a layer of photoresist 403. At step 104, photoresist layer 403 is exposed and developed using a patterned mask layer 404. FIG. 4A depicts a cross-sectional view of the wafer structure formed by substrate layer 401, seed layer 402, photoresist layer 403 and patterned mask layer 404 before photoresist layer 403 is exposed and developed.

At step 305, the wafer structure is dry etched. FIG. 4B depicts a cross-sectional view of the wafer structure after dry etching. For example, a standard poly etch using chorine ($Cl_2$) and bromine ($Br_2$) gases could be used, followed by a highly selective low-bias $Br_2$ gas etch in step 305 to provide an undamaged surface of Si. Alternatively, the wafer structure could be wet etched in a well-known manner.

Figure 4C:
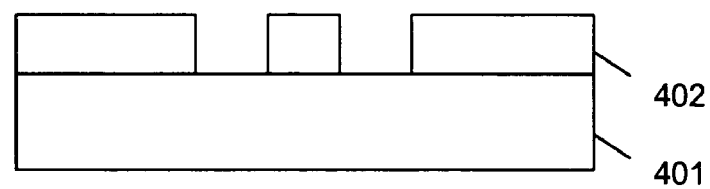

At step 306, photoresist layer 403 is stripped in a well-known manner. FIG. 4C depicts a cross-sectional view of the wafer structure after photoresist layer 403 has been stripped.

Figure 4D:
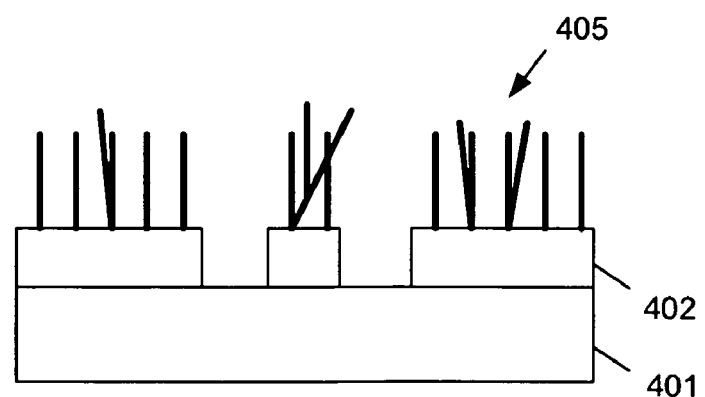

At step 307, ZnO nanostructure growth is induced via a vapor-solid mechanism to form nanostructures 405, shown in FIG. 4D. ZnO nanowire growth occurs only in regions of substrate 401 that were left coated with seed layer 402. In particular, the wafer structure formed by layers 401 and 402 and depicted in FIG. 4C is exposed to Zn vapor at about 915° C. for about 30 minutes with a flow of about 30-80 sccm Ar and a trace amount of oxygen. Zinc vapor is generated by, for example, carbothermal reduction of ZnO power using equal parts of ZnO and graphite. In principle, however, any method of supplying gaseous phase Zn for growing ZnO nanostructures would be suitable.

In yet another exemplary embodiment of the present invention described in detail in concurrently filed and co-owned U.S. patent application Ser. No. 10/976,594, entitled "ALD ZnO Seed Layer For Deposition of ZnO Nanostructures On A Silicon Substrate," invented by J. F. Conley and L. Stecker, and incorporated by reference herein, a seed layer form by an ALD technique is used for growing ZnO nanostructures. Alternatively, the seed layer can be form by using a spin-on technique.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a zinc-oxide nanostructure, comprising:
   providing a substrate;
   forming a seed layer of polycrystalline zinc oxide on a surface of the substrate;
   patterning the seed layer;
   inducing growth of at least one zinc-oxide nanostructure substantially over the patterned seed layer.

2. The method according to claim 1, wherein forming the seed layer forms the seed layer of polycrystalline zinc oxide using an atomic layer deposition technique.

3. The method according to claim 2, wherein forming the seed layer further includes forming the seed layer using alternating pulses of a diethylzinc precursor and water vapor.

4. The method according to claim 2, wherein the seed layer is at least about 0.5 nm thick.

5. The method according to claim 1, wherein forming the patterned seed layer includes etching the seed layer.

6. The method according to claim 1, wherein inducing growth of at least one zinc-oxide nanostructure includes exposing the patterned seed layer to zinc vapor in the presence of a trace amount of oxygen.

7. The method according to claim 6, wherein inducing growth of at least one zinc-oxide nanostructure further includes forming zinc vapor by carbothermal reduction of zinc oxide.

8. The method according to claim 6, further comprising annealing the seed layer before inducing growth of at least one zinc-oxide nanostructure.

9. The method according to claim 1, wherein forming the seed layer forms the seed layer of polycrystalline zinc oxide using a spin-on technique.

10. The method according to claim 9, wherein forming the seed layer forms the seed layer of polycrystalline zinc oxide further based on a metal organic deposition technique.

11. The method according to claim 10, further comprising annealing the seed layer before inducing growth of at least one zinc-oxide nanostructure.

12. The method according to claim 9, wherein forming the seed layer forms the seed layer of polycrystalline zinc oxide further based on one of a spray pyrolisis technique, an RF sputtering technique and by oxidation of a zinc thin film layer formed on the substrate.

13. A zinc-oxide nanostructure formed by:
   providing a substrate;
   forming a seed layer of polycrystalline zinc oxide on a surface of the substrate;
   patterning the seed layer;
   inducing growth of at least one zinc-oxide nanostructure substantially over the patterned seed layer.

14. The zinc-oxide nanostructure according to claim 13, wherein forming the seed layer forms the seed layer of polycrystalline zinc oxide using an atomic layer deposition technique.

15. The zinc-oxide nanostructure according to claim 14, wherein forming the seed layer further includes forming the seed layer using alternating pulses of a diethylzinc precursor and water vapor.

16. The zinc-oxide nanostructure according to claim 14, wherein the seed layer is at least about 0.5 nm thick.

17. The zinc-oxide nanostructure according to claim 13, wherein forming the patterned seed layer includes etching the seed layer.

18. The zinc-oxide nanostructure according to claim 13, wherein inducing growth of at least one zinc-oxide nanostructure includes exposing the patterned seed layer to zinc vapor in the presence of a trace amount of oxygen.

19. The zinc-oxide nanostructure according to claim 18, wherein inducing growth of at least one zinc-oxide nanostructure further includes forming zinc vapor by carbothermal reduction of zinc oxide.

20. The zinc-oxide nanostructure according to claim 18, further comprising annealing the seed layer before inducing growth of at least one zinc-oxide nanostructure.

21. The zinc-oxide nanostructure according to claim 13, wherein forming the seed layer forms the seed layer of polycrystalline zinc oxide using a spin-on technique.

22. The zinc-oxide nanostructure according to claim 21, wherein forming the seed layer forms the seed layer of polycrystalline zinc oxide further based on a metal organic deposition technique.

23. The zinc-oxide nanostructure according to claim 22, further comprising annealing the seed layer before inducing growth of at least one zinc-oxide nanostructure.

24. The zinc-oxide nanostructure according to claim 21, wherein forming the seed layer forms the seed layer of polycrystalline zinc oxide further based on one of a spray pyrolisis technique, an RF sputtering technique and by oxidation of a zinc thin film layer formed on the substrate.

25. A zinc-oxide nanostructure, comprising:
   a substrate;
   a patterned seed layer of polycrystalline zinc oxide formed on a surface of the substrate; and
   at least one zinc-oxide nanostructure formed substantially over the patterned seed layer.

26. The zinc-oxide nanostructure according to claim 25, wherein the seed layer is formed by an atomic layer deposition technique.

27. The zinc-oxide nanostructure according to claim 26, wherein the seed layer is further formed by using alternating pulses of a diethylzinc precursor and water vapor.

28. The zinc-oxide nanostructure according to claim 25, wherein the seed layer is at least about 0.5 nm thick.

29. The zinc-oxide nanostructure according to claim 25, wherein the patterned seed layer is formed by etching the seed layer.

30. The zinc-oxide nanostructure according to claim 25, wherein at least one zinc-oxide nanostructure is formed by exposing the patterned seed layer to zinc vapor in the presence of a trace amount of oxygen.

31. The zinc-oxide nanostructure according to claim 30, wherein the zinc vapor is generated by carbothermal reduction of zinc oxide.

32. The zinc-oxide nanostructure according to claim 30, wherein the seed layer is annealed before growth of at least one zinc-oxide nanostructure is induced.

33. The zinc-oxide nanostructure according to claim 25, wherein the seed layer is formed by a spin-on technique.

34. The zinc-oxide nanostructure according to claim 33, wherein forming the seed layer forms the seed layer of polycrystalline zinc oxide further based on a metal organic deposition technique.

35. The zinc-oxide nanostructure according to claim 33, wherein the seed layer is formed by one of a spray pyrolisis technique, an RF sputtering technique and by oxidation of a zinc thin film layer formed on the substrate.

* * * * *